(12) United States Patent
Gonsalves et al.

(10) Patent No.: US 6,377,459 B1
(45) Date of Patent: Apr. 23, 2002

(54) CHIP COOLING MANAGEMENT

(75) Inventors: Daniel D. Gonsalves, Hudson, NH (US); Robert S. Antonuccio, Burlington, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/632,306

(22) Filed: Aug. 4, 2000

(51) Int. Cl.$^7$ .................................................. H05K 7/20
(52) U.S. Cl. .................. 361/700; 160/80.2; 160/104.33; 160/104.26; 174/15.2
(58) Field of Search ............................... 165/80.2, 80.3, 165/185, 104.26, 104.33, 104.34; 174/15.2, 16.3; 361/687, 697, 699, 700, 704, 707, 715

(56) References Cited

U.S. PATENT DOCUMENTS

| | | | |
|---|---|---|---|
| 5,365,749 A | * 11/1994 | Porter | 361/700 |
| 5,549,155 A | * 8/1996 | Meyer, IV et al. | 165/104.33 |
| 5,630,469 A | 5/1997 | Butterbaugh et al. | 165/80.3 |
| 5,647,429 A | 7/1997 | Oktay et al. | 165/104.26 |
| 5,719,745 A | 2/1998 | Agonafer et al. | 361/704 |
| 5,734,554 A | 3/1998 | Mitty et al. | 361/697 |
| 5,875,095 A | * 2/1999 | Webb | 361/700 |
| 6,018,465 A | 1/2000 | Borkar et al. | 361/825 |
| 6,038,128 A | * 3/2000 | Hood, III et al. | 361/687 |
| 6,054,676 A | 4/2000 | Wall et al. | 219/209 |
| 6,094,346 A | * 7/2000 | Schweers et al. | 361/695 |
| 6,125,035 A | * 9/2000 | Hood, III et al. | 361/687 |
| 6,212,074 B1 | * 4/2001 | Gonsalves et al. | 361/690 |

OTHER PUBLICATIONS

Website: LURL:http://www.thermacore.com/hpt$^-$how.htm>Jul. 18, 2000.

* cited by examiner

Primary Examiner—Gregory Thompson
(74) Attorney, Agent, or Firm—Rosenthal & Osha L.L.P.

(57) ABSTRACT

A cooling assembly for cooling chips is disclosed. The assembly includes a heat sink, a plate member, and a heat pipe. The heat sink is attachable to a first chip. The plate member is attachable to a second chip. The heat pipe is arranged between the heat sink and plate member such that one end of the heat pipe attaches to the heat sink and the other end of the heat pipe attaches to the plate member. A system for cooling chips and method for dissipating heat generated by chips are also disclosed.

29 Claims, 4 Drawing Sheets

CHIP COOLING MANAGEMENT

BACKGROUND OF THE INVENTION

1. Technical Field

The invention relates to an apparatus for cooling chips on a circuit board.

2. Background Art

The demand for smaller, faster, more powerful computers and electronic devices has led to rapid technological advances in the development of smaller, more complex integrated circuits embedded in small pieces of semiconducting material, know as chips. In recent years, these advances have resulted in chips with increased operating speeds, more transistors, and enhanced performance. While these advances have led to smaller chips with faster circuits, they have also resulted in chips with increased power consumption and greater heat generation. As a result, heat dissipation requirements for chips have increased.

Additionally, the demand for smaller, more compact computers and electronic devices has led to more compact circuit board arrangements and smaller system housings. As a result, the space available for attaching heat dissipating devices and providing airflow over these devices has decreased. Due to increased dissipation requirements and airflow and space restrictions, there exists a need for more compact heat dissipating devices able to adequately cool chips while occupying minimal space.

FIG. 1 illustrates a commonly used heat dissipating device for chips, known as a conventional finned heat sink 1. This heat sink includes a base 2 and a plurality of fins 3 which extend from the base 2. The base 2 of the heat sink 1 is configured to attach to the top of a chip. Heat generated by the chip transfers through the base 2 of the heat sink to the fins 3 for ultimate dissipation to cooler surrounding air in the system. The fins 3 of the heat sink 1 are typically arranged so that airflow in the system will pass between the fins 3. In many systems, fans are used to increase airflow through the system, thereby accelerating the transfer of heat from the fins 3 to the surrounding air.

In more compact computer systems, space restrictions may not allow for placement of an adequately-sized conventional finned heat sink on top of a chip. In such cases, alternative heat dissipating devices must be considered. One alternative device, used more frequently in recent years, is a heat pipe.

Heat pipes typically include a sealed vessel with a vacuum formed inside. One end of a heat pipe (called the evaporator) attaches to the surface of a chip, and the other end of the heat pipe (called the condenser) extends away from the chip for exposure to cooler system air. Usually, heat pipes also include a wick structure inside the vessel, lining the walls of the vessel, and a working fluid inserted in the vessel, just enough to saturate the wick structure. The atmosphere in the vessel is set such that, absent heat transfer, the fluid is maintained at a liquid-vapor equilibrium.

When a heat pipe is attached to a chip generating heat, heat is transferred from the chip to the attached evaporator end of the heat pipe. This transfer of heat results in the generation of a higher pressure vapor at the evaporator end. The phase change of the fluid from liquid to vapor results in the absorption of a substantial amount of heat. The higher pressure of the vapor at the evaporator end of the heat pipe causes the vapor to flow in a direction toward the condenser end of the heat pipe. The lower temperature at the condenser causes the vapor to condense back to a liquid, thereby releasing its latent heat of vaporization to the condenser. The fluid condensed at the condenser end of the heat pipe then saturates the wick structure and gets pumped back to the evaporator end of the heat pipe by capillary forces developed in the wick structure. This continuous cycle of vaporization-condensation allows heat pipes to transfer large quantities of heat with very low thermal gradients. Heat pipes may also include a plurality of fins around the outside surface of the condenser to enhance heat dissipation from the condenser to the surrounding air, thereby, keeping the walls at the condenser cooler and increasing the heat transfer performance of the heat pipe.

In more compact computer systems where system components are placed closer together, space restrictions may not allow for the use of a conventional heat pipe which include an extending end surrounded by fins. Therefore, a more compact heat dissipation device able to adequately dissipate heat while occupying minimal space is desired. Additionally, in compact systems where two or more chips are placed in close proximity to each other, a compact heat dissipation device able to adequately dissipate heat from the two or more chips is desired.

One example of a circuit board configured for placement in a compact system is shown in FIG. 2. In this example, the circuit board 10 is the main board (or motherboard 10) of a computer system. This motherboard 10 includes an array of 8 chips (generally at 12) located between two connector banks where CPU models are to be connected to the motherboard 10 (connectors shown at 18). The motherboard board 10 mounts into a system such that two of the chips 14, 16 at the end of the array 12, which produce a great amount of heat, are located furthest from system fans (not shown). As a result, these chips 14, 16 receive the warmest air (after it has passes by other components in the system) and are the most difficult to keep cool. This cooling problem is further complicated by the fact that no room is available above one of the chips 16 for attaching a conventional finned heat sink. Additionally, no room is available around the chip for use of a conventional heat pipe with an extending end surrounded by fins. In view of these space restrictions and the general trend toward more compact systems and circuit boards and chips with greater heat dissipation needs, it can be seen that alternative heat dissipating devices which are compact in arrangement yet adequate in cooling are needed and increasingly desired.

SUMMARY OF THE INVENTION

In one aspect, the invention relates to an assembly for cooling chips. The assembly includes a heat sink, a plate member, and a heat pipe. The heat sink is attachable to a first chip. The plate member is attachable to a second chip. The heat pipe is arranged between the heat sink and plate member such that one end of the heat pipe attaches to the heat sink and another end of the heat pipe attaches to the plate member.

In another aspect, the invention relates to a chip cooling system for cooling chips. The chip cooling system includes a chip cooling assembly which attaches to a plurality of chips, and a airflow directing means for directing airflow across the chip cooling assembly. In one embodiment, the means for directing airflow includes an channel attached to the circuit board and extending over the chip cooling assembly and plurality of chips.

In another aspect, the invention provides a method for dissipating heat generated by a first chip and a second chip which are positioned near each other on a circuit board. The method includes transferring heat from the first chip to a heat sink by attaching the heat sink to the first chip. The heat sink includes a plurality of protruding members and a groove formed through the protruding members. The method also includes transferring heat from the second chip to a plate member by attaching the plate member to the second chip. The plate member has a groove formed in it. Additionally, the method includes transferring heat from the plate member to the heat sink by attaching a heat pipe to the heat sink and the plate member. The heat pipe has a first end and a second end. The first end is disposed within the groove of the heat sink. The second end is disposed within the groove of the plate member.

Advantages of the invention include, at least, a chip cooling assembly which can attach to multiple chips to provide cooling for the chips when space is not available proximal to one of the chips for attaching a conventional finned heat sink. Additionally, the invention may provide a cooling assembly which uses the fins of one heat sink to assist in the cooling of multiple chips.

Other aspects and advantages of the invention will be apparent from the following description and the appended claims.

DETAILED DESCRIPTION OF THE INVENTION

Figure 1:
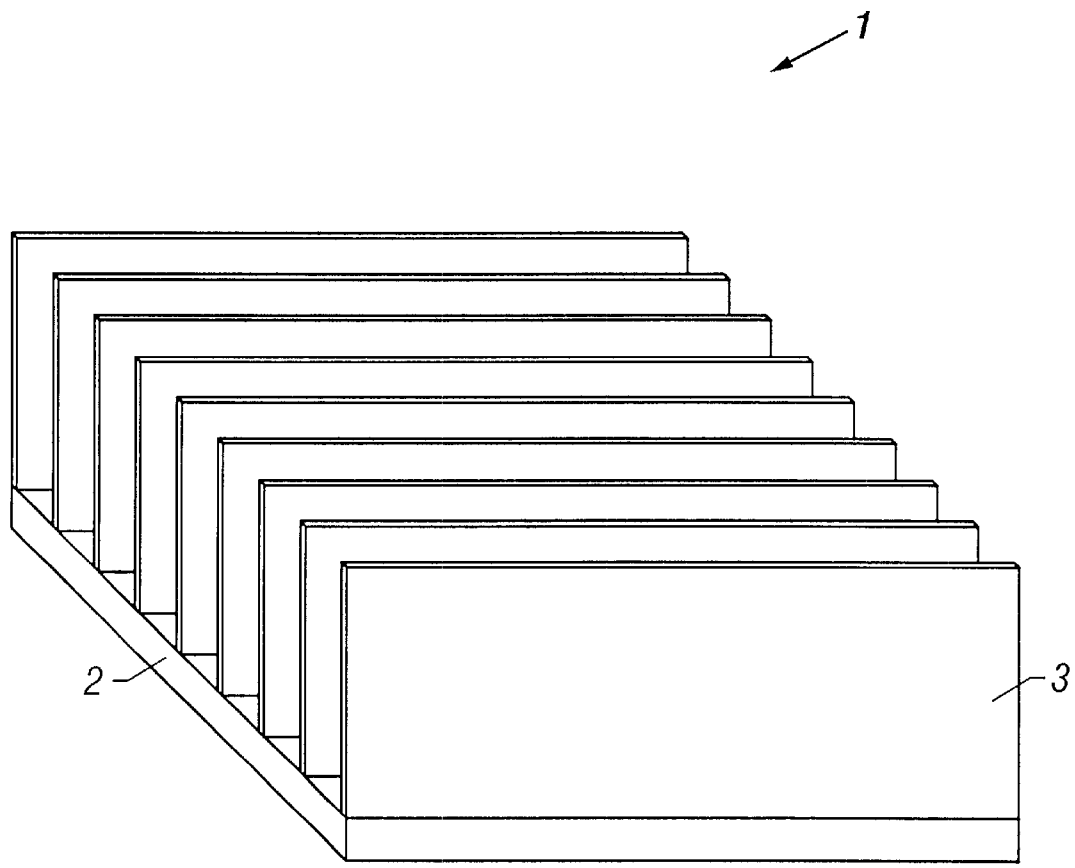
FIG. 1 shows one example of a prior art heat dissipating device for cooling a chip.
Figure 2:
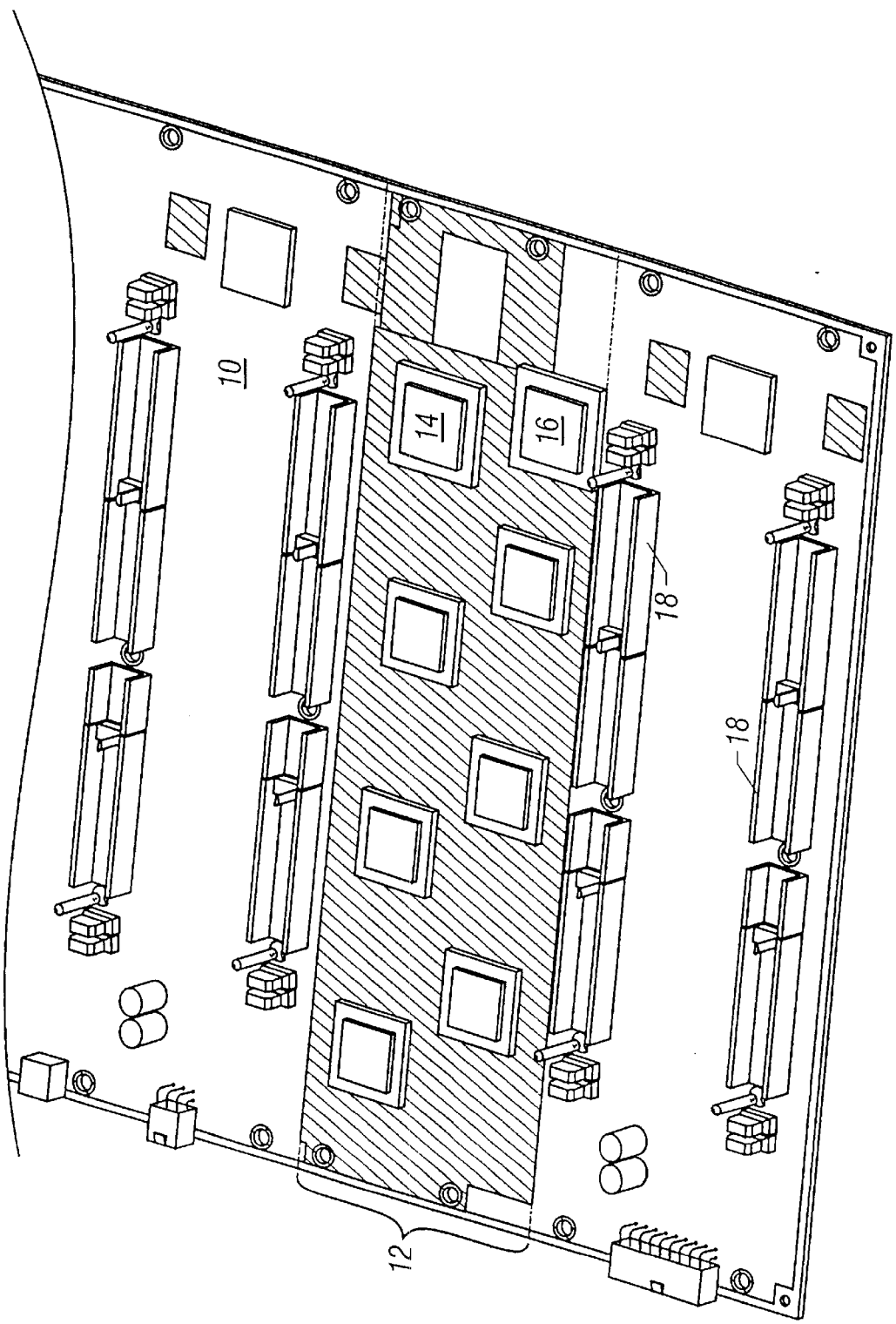
FIG. 2 shows one example of a compact circuit board configured for mounting in a compact system.

Exemplary embodiments of the invention will now be described with reference to the accompanying drawings. Like items in the drawings are shown with the same reference numbers.

Figure 3:
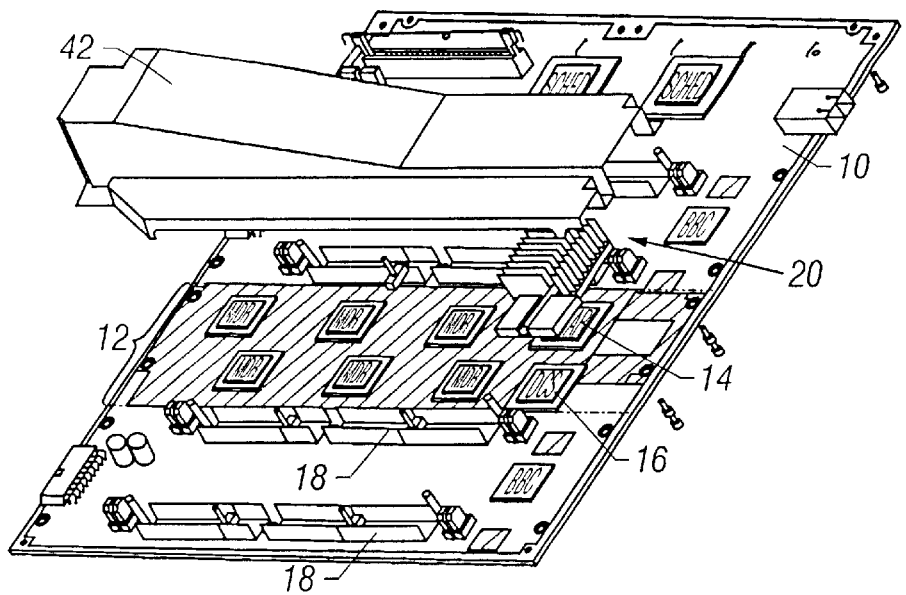
FIG. 3 shows one embodiment of a chip cooling system positioned for mounting on a circuit board.
Figure 4:
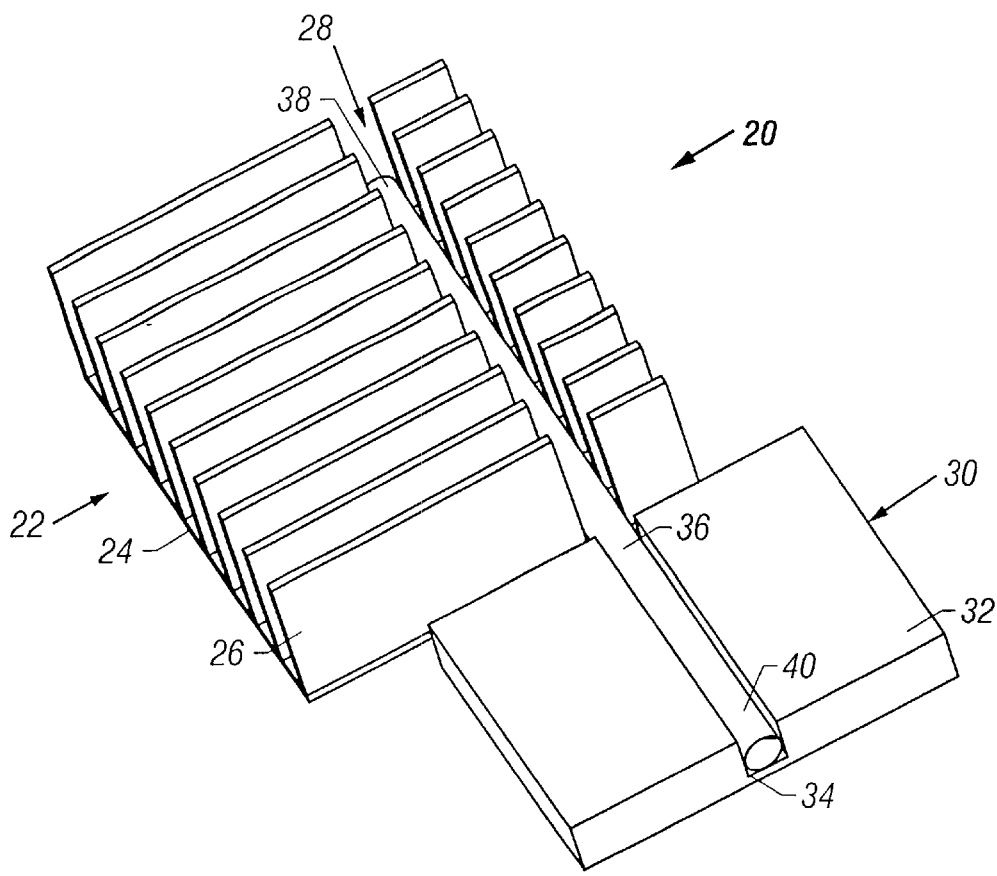
FIG. 4 shows one embodiment of a chip cooling assembly for cooling multiple chips.

FIGS. 3 and 4 illustrate one embodiment of a chip cooling assembly 20 in accordance with the invention. Shown in more detail in FIG. 4, this cooling assembly 20 includes a finned heat sink 22, a plate member 30, and a heat pipe 36. The heat sink 22 is arranged to attach to a first chip 14 and the plate member 30 is arranged to attach to a second chip 16. The heat pipe 36 has two ends 38, 40 and is arranged such that one end 38 attaches to the heat sink 22 and the other end 40 attaches to the plate member 30. It should be understood that the term "end", used in reference to the heat pipe, is used to refer generally to an end section of the heat pipe.

In this embodiment, the heat sink 22 includes a base portion 24 and a plurality of fins 26 which extend from the base portion 24. The base portion 24 of the heat sink 22 includes a substantially flat bottom surface configured to attach to a top surface of the first chip 14. The heat sink 22 also includes a groove 28 formed through the fins 26 of the heat sink 22. The groove 28 is configured for placement of one end 38 of the heat pipe 36 through the fins 26. This arrangement, allows the fins 26 of the heat sink 22 to dissipate heat transferred from the base portion 24 of the heat sink 22 and from the end 38 of the heat pipe 36 to surrounding air. In other embodiments, the groove may comprise any aperture which allows placement of one end of the heat pipe through the fins of the heat sink, such as a hole for example. Preferably, in this embodiment, the heat sink 22 is made of a material having good heat transfer properties, such as copper, aluminum, etc.

It should be understood that fins 26 shown in this embodiment are just one example of a protruding member which may be used for a heat sink. In other embodiments, the heat sink may include a different type of protruding member. For example, in alternative embodiments, the heat sink may comprise a base portion and a plurality of pins which extend from the base portion. One skilled in the art will appreciate that any conventional protruding member may be used for the heat sink without departing from the spirit of the invention.

In this embodiment, the plate member 30 includes a substantially flat body 32 configured to attach to a top surface of a second chip 16. The plate member 30 also includes a groove 34 formed along the top surface of the body 32 for placement of the other end 40 of the heat pipe 36 on the body 32. Preferably, the plate member 30 is made from a material having good heat transfer properties, such as copper, aluminum, etc. In a specific embodiment, the plate member 30 may be formed of aluminum because of its good heat transfer characteristics and light weight. However, it should be understood that in other embodiments any material may be used as determined by the assembly designer. Additionally, in other embodiments the plate member may connect to or be formed integrally with another component, such as a base portion of a heat sink, for example, without departing from the spirit of the invention.

Figure 5:
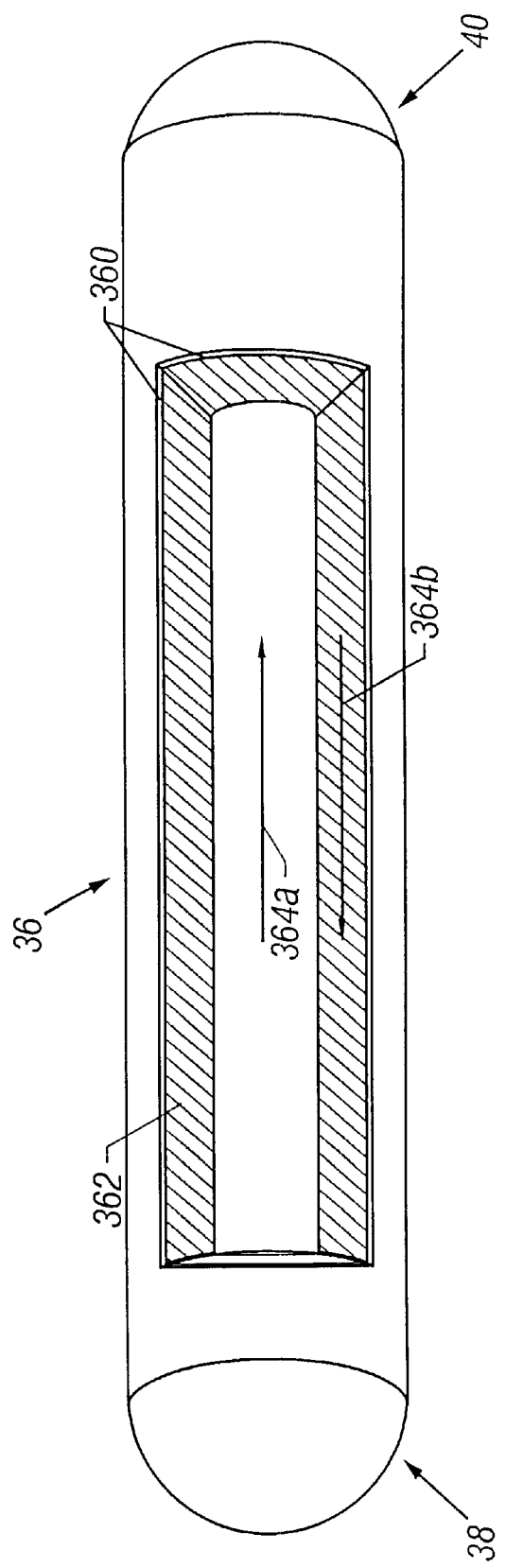
FIG. 5 shows one example of a heat pipe in accordance with the invention.

In this embodiment, the heat pipe 36 includes a sealed, evacuated tubular vessel 360 with a wick structure and working fluid disposed inside the vessel. One example of a heat pipe 36 having a front cutaway section removed for convenience of illustration is shown in FIG. 5. As shown, the wick structure 362 in the vessel lines the inner walls of the vessel 360. The vessel 360 is backfilled with just enough working fluid to saturate the wick structure 362. In this example, the flow of the working fluid during heat transfer is illustrated by arrows 364a (vapor) and 364b (liquid).

As shown for the embodiment in FIG. 4, the heat pipe has two ends 38, 40. One end 38 (the evaporator) is positioned in the groove 28 of the heat sink 22 and attached to the heat sink 22. The other end 40 (the condenser) is positioned in the groove 34 of the plate member 30 and attached to the plate member 30. In this embodiment, the vessel 360 of the heat pipe 36 is preferably formed of a material with good heat transfer characteristics, such as copper, aluminum, etc. The working fluid (illustrated by arrows 364a and 364b) is preferably a fluid having good thermal conductivity and high latent heat of vaporization, such as deionized water, for example. However, in other embodiments any heat pipe providing the benefits of two-phase heat transfer may be used, such as those manufactured by Thermacore, Inc. of Lancaster, Pa. Therefore, in other embodiments the vessel of the heat pipe may be a shape other than tubular and may be formed from any material with adequate heat transfer properties, including metals (e.g., copper, aluminum, steel) and composite polyamides. Also, in other embodiments, any conventional wick structure may be used, including artery wicks, axial grooves, annular and crescent wicks, sintered metal, wrapped screens, composite screen-covered grooves, and slab and tunnel wicks. Additionally, in other embodiments, any working fluid may be used which provides adequate thermal conductivity and sufficient latent heat of vaporization, such as ammonia, fluorocarbon, methanol, or water, for example.

In an alternative aspect, the invention relates to a chip cooling system for cooling multiple chips on a circuit board. FIG. 3 shows one embodiment in accordance with this aspect of the invention. In this embodiment, a chip cooling system includes a chip cooling assembly 20 configured to attach to a plurality of chips 14, 16 on a circuit board 10 and an air channel 42 configured to directing airflow across the chip cooling assembly 20. The chip cooling assembly 20 in this embodiment is similar to the cooling assembly previously discussed with reference to FIG. 4.

In this embodiment, the air channel 42 is a channel configured to attach to the circuit board 10 to define a passage through which airflow can be directed across the chips 12 and chip cooling assembly 20. Preferably, the air channel 42 is formed of a light weight, non-conducting material, such as plastic. However, any material may be used for the air channel 42 with out departing from the spirit of the invention.

In this embodiment, because the last two chips 14, 16 generate the most heat and are cooled by warmer system air (e.g., warmed by cooling the first six chips in the array 12), the air channel 42 is configured to define a passage which gradually decreases in size between the inlet and outlet to funnel airflow in the channel over the cooling assembly 20 on these chips 14, 16. By providing an air channel 42 which directs and funnels airflow across the chip cooling assembly 20, the heat transfer performance of the cooling assembly 20 on the remotely located chips 14, 16 (i.e., chips located a distance away from system fans) may be further improved. However, the invention is not limited to a channel configured to funnel airflow. Rather any air channel configuration may be used as determined by the system designer without departing from the spirit of the invention.

In real-life applications, cooling systems in accordance with the invention have been successfully used to cool remotely located chips in compact, space-limited systems. The use of these cooling systems has resulted in chips being brought within acceptable thermal levels over entire ranges of environmental specifications and system bus speeds.

As a result of the various structures described in detail above, advantages of the invention may include one or more of the following: Embodiments of the invention may provide a chip cooling assembly which attaches to a plurality of chips to provide adequate cooling in compact, space restricted systems. Embodiments of the invention may provide a chip cooling assembly for a remotely located chip which generates large amounts of heat and lacks adequate space for fins extending from the chip. Embodiments of the invention may provide a cooling assembly which uses a single set of fins to assist in cooling of multiple chips. Embodiments of the invention may also provide a chip cooling assembly which can transfer heat away from a "hotter" chip to a heat sink on a "cooler" chip, to aid in the dissipation of heat from the hotter chip.

Although the invention has been described with respect to exemplary embodiments, the invention is not limited to the embodiments shown and described or the advantageous listed above. Rather, the scope of the invention is intended to be limited only by the scope of the following claims.

What is claimed is:

1. A chip cooling assembly, comprising:
   a heat sink attachable to a first chip;
   a plate member attachable to a second chip; and
   a heat pipe having a first end attached to the heat sink and a second end attached to the plate member;
   wherein the heat sink comprises:
      a base portion,
      a plurality of protruding members extending from the base portion, and
      a groove formed through the protruding members; and
   wherein the first end of the heat pipe is positioned in the groove.

2. The assembly of claim 1, wherein the protruding members comprise fins.

3. The assembly of claim 1, wherein the protruding members comprise pins.

4. The assembly of claim 1, wherein the heat sink comprises aluminum.

5. The assembly of claim 1, wherein the plate member comprises a substantially flat body configured to attach to a top surface of the second chip.

6. The assembly of claim 5, wherein the plate member further comprises a groove extending across the body and the second end of the heat pipe is positioned in the groove.

7. The assembly of claim 6, wherein the plate member comprises aluminum.

8. The assembly of claim 1, wherein the heat pipe comprises a sealed evacuated vessel having a wick structure and a working fluid disposed therein.

9. The assembly of claim 8, wherein the wick structure is disposed proximal to a wall of the vessel.

10. The assembly of claim 8, wherein the working fluid comprises water.

11. The assembly of claim 8, wherein the vessel of the heat pipe comprises copper.

12. A chip cooling assembly, comprising:
    a heat sink attachable to a first chip;
    a plate member attachable to a second chip; and
    a heat pipe having a first end attached to the heat sink and a second end attached to the plate member;
    wherein the heat sink comprises a plurality of protruding members and
    a groove formed through the protruding members;
    wherein the plate member comprises a substantially flat body and a groove disposed in the body; and
    wherein the heat pipe is arranged such that the first end is positioned in the groove of the heat sink and the second end is positioned in the groove of the plate member.

13. A chip cooling assembly, comprising:
    a heat sink having a base portion configured to attach to a first chip, a plurality of fins extending from the base portion, and a groove formed through the plurality of fins,
    a plate member having a substantially flat body configured to attach to a second chip, and a groove formed in the body,
    a heat pipe having a first end and a second end, the heat pipe comprising a sealed evacuated vessel having a wick structure and a working fluid disposed therein, the wick structure lining a wall of the vessel and the working fluid comprising water, the heat pipe arranged such that the first end is disposed in the groove of the heat sink and the second end is disposed in the groove of the plate member.

14. A chip cooling system, comprising:
    a chip cooling assembly attached to a plurality of chips on a circuit board to dissipate heat generated by the plurality of chips; and
    an airflow directing means for directing airflow across the chip cooling assembly;

wherein the chip cooling assembly comprises:
- a heat sink attachable to a first chip of the plurality of chips,
- a plate member attachable to a second chip of the plurality of chips, and
- a heat pipe having a first end attached to the heat sink and a second end attached to the plate member; and wherein the heat sink comprises a base portion and a plurality of protruding members extending from the base portion.

15. The system of claim 14, wherein the protruding members comprise fins.

16. The system of claim 14, wherein the protruding members comprise pins.

17. The system of claim 14, wherein the heat sink further comprises a groove formed through the protruding members, and the first end of the heat pipe is positioned in the groove of the heat sink.

18. The system of claim 17, wherein the heat sink comprises aluminum.

19. The system of claim 14, wherein the plate member comprises a substantially flat body.

20. The system of claim 14, wherein the plate member further comprises a groove extending across the body and the second end of the heat pipe is positioned in the groove.

21. The system of claim 20, wherein the plate member comprises aluminum.

22. The system of claim 14, wherein the heat pipe comprises a sealed evacuated vessel having a wick structure and a working fluid disposed therein.

23. The system of claim 22, wherein the working fluid comprises water.

24. The system of claim 22, wherein the vessel of the heat pipe comprises copper.

25. A chip cooling system, comprising:
- a chip cooling assembly attached to a plurality of chips on a circuit board to dissipate heat generated by the plurality of chips; and
- an air flow directing means for directing airflow across the chip cooling assembly;

wherein the chip cooling assembly comprises:
- a heat sink attachable to a first chip of the plurality of chips, wherein the heat sink comprises a plurality of protruding members and a groove formed through the protruding members,
- a plate member attachable to a second chip of the plurality of chips, wherein the plate member comprises a substantially flat body and a groove disposed in the body, and
- a heat pipe having a first end attached to the heat sink and second end attached to the plate member, wherein the heat pipe is arranged such that the first end is positioned in the groove of the heat sink and the second end is positioned in the groove of the plate member.

26. The system of claim 14, wherein the airflow directing means comprises a channel attached to the circuit board and extending over the chip cooling assembly and the plurality of chips to form a passage directing airflow across the plurality of chips and the chip cooling assembly.

27. The system of claim 26, wherein the channel comprises plastic.

28. The system of claim 26, wherein the channel comprises a section configured to gradually decreasing in size to funnel the airflow.

29. A method for dissipating heat generated by a first chip and a second chip proximal to each other on a circuit board, the method comprising:
- transferring heat from the first chip to a heat sink by attaching the heat sink to the first chip, the heat sink having a plurality of protruding members and a groove formed through the protruding members;
- transferring heat from the second chip to a plate member by attaching the plate member to the second chip, the plate member having a groove formed therein;
- transferring heat from the plate member to the heat sink by attaching a heat pipe to the heat sink and the plate member, the heat pipe having a first end disposed within the groove of the heat sink and a second end disposed within the groove of the plate member.

* * * * *